(12) United States Patent
Jennrich et al.

(10) Patent No.: US 8,921,492 B2
(45) Date of Patent: Dec. 30, 2014

(54) MODIFIED REACTION RESIN

(75) Inventors: Irene Jennrich, Winnenden (DE);
Christian Eger, Bardowick (DE)

(73) Assignees: Robert Bosch GmbH, Stuttgart (DE);
Evonik Hanse GmbH, Geesthacht (DE)

( * ) Notice: Subject to any disclaimer, the term of this patent is extended or adjusted under 35 U.S.C. 154(b) by 184 days.

(21) Appl. No.: 12/747,673

(22) PCT Filed: Feb. 24, 2009

(86) PCT No.: PCT/EP2009/052152
§ 371 (c)(1),
(2), (4) Date: Jun. 11, 2010

(87) PCT Pub. No.: WO2009/109482
PCT Pub. Date: Sep. 11, 2009

(65) Prior Publication Data
US 2010/0261822 A1 Oct. 14, 2010

(30) Foreign Application Priority Data

Mar. 7, 2008 (EP) .................... 08004250

(51) Int. Cl.
| | | |
|---|---|---|
| *C08L 83/04* | (2006.01) | |
| *C08K 5/29* | (2006.01) | |
| *C08L 79/04* | (2006.01) | |
| *C08G 77/06* | (2006.01) | |
| *C08G 77/12* | (2006.01) | |
| *C08G 77/14* | (2006.01) | |
| *C08G 77/42* | (2006.01) | |
| *C08G 77/46* | (2006.01) | |
| *C08G 77/00* | (2006.01) | |
| *C08K 5/315* | (2006.01) | |

(52) U.S. Cl.
CPC ............... *C08L 79/04* (2013.01); *C08L 83/04* (2013.01); *C08G 77/06* (2013.01); *C08G 77/12* (2013.01); *C08G 77/14* (2013.01); *C08G 77/42* (2013.01); *C08G 77/46* (2013.01); *C08G 77/70* (2013.01); *C08K 5/315* (2013.01)
USPC .......................... 525/393; 525/474; 525/540

(58) Field of Classification Search
USPC ........................................ 525/393, 474, 540
See application file for complete search history.

(56) References Cited

U.S. PATENT DOCUMENTS

| | | | |
|---|---|---|---|
| 4,853,434 A | 8/1989 | Block | |
| 6,469,074 B1 * | 10/2002 | Hino et al. | 523/466 |
| 7,601,429 B2 * | 10/2009 | Kato et al. | 428/458 |
| 7,666,509 B2 * | 2/2010 | Mori et al. | 428/416 |
| 2003/0130412 A1 | 7/2003 | Mizuno et al. | |
| 2005/0096423 A1 * | 5/2005 | Jennrich et al. | 524/492 |
| 2005/0129895 A1 * | 6/2005 | Nakamura | 428/40.1 |
| 2006/0099391 A1 | 5/2006 | Tomioka et al. | |
| 2008/0032089 A1 * | 2/2008 | Bauer et al. | 428/116 |
| 2011/0124811 A1 * | 5/2011 | Spitz et al. | 524/786 |
| 2012/0153532 A1 * | 6/2012 | Jennrich et al. | 264/235 |

FOREIGN PATENT DOCUMENTS

| | | |
|---|---|---|
| DE | 103 60 895 | 7/2004 |
| DE | 10 2006 041 037 | 11/2007 |
| EP | 0 266 513 | 5/1988 |
| EP | 1 275 696 | 1/2003 |
| GB | 2 398 790 | 9/2004 |
| JP | 2001-339130 | 12/2001 |
| JP | 2002-309084 | 10/2002 |
| JP | 2006-291098 | 10/2006 |
| JP | 2006-348187 | 12/2006 |
| JP | 2007-269922 | 10/2007 |

OTHER PUBLICATIONS

Kessler, Michael R. Cyanate Ester Resins. Submission for the International Encyclopedia of Composites, second edition. Feb. 22, 2011.*

* cited by examiner

*Primary Examiner* — Mike M Dollinger
(74) *Attorney, Agent, or Firm* — Michael J. Striker

(57) ABSTRACT

The object of the patent is to provide a modified reaction resin, comprising: a) at least one cyanate tester; b) at least one polyorganosiloxane contained in the reaction resin in finely distributed form. The thus modified reaction resin is stable for storage for long periods in non-cured form and can be cured to form duromers with advantageous mechanical characteristics.

19 Claims, No Drawings

MODIFIED REACTION RESIN

The present invention relates to a modified reaction resin, a method for its manufacture, and its use to manufacture thermosetting plastics.

Reaction resins are known in the related art. These are products that may be fluidly or plastically deformable before processing, and that yield thermosetting plastics via a polyreaction (in particular polymerization, polycondensation or polyaddition) and processing that is typically shaping in nature. The polyreaction results in a three-dimensionally cross-linked, hard and non-fusible resin which is referred to duromer.

Cross-linked reaction resins typically have good hardness, strength, resistance to chemicals, and temperature stability. These advantageous properties are due to a cross-link density that is typically high. Due to these properties, reaction resins are used, e.g., to manufacture fiber-reinforced plastics which are used in the manufacture of insulation and casting compounds in electrical technology, in the manufacture of structural adhesives, laminated plastics, stoving lacquers, and the like.

However, the high degree of cross-linking, which results in the aforementioned advantageous properties, also causes several disadvantages. Duromers are typically brittle and have a low resistance to breakage and impact, in particular at low temperatures.

It has already been proposed (EP-A-0 266 513) to improve the mechanical properties of reaction resins via the addition of polyorganosiloxanes.

The object of the present invention is to provide a modified reaction resin that, as an intermediate product that has not yet cured, has good storage and processing properties and may be processed into duromers having good mechanical properties.

The reaction resin that is modified according to the present invention contains:
a) at least one cyanate ester;
b) at least one polyorganosiloxane that is contained in the reaction resin in a finely distributed form.

At this point, a few terms that are used within the scope of the present invention will be explained.

Cyanate esters include an —O—C≡N group. Cyanate ester monomers or prepolymers may cross-link with each other via a "cyclotrimerization" of three OCN groups. This cyclotrimerization, as a curing reaction, typically takes place at a high temperature (usually 150 to 250° C.), advantageously in the presence of suitable tertiary amines as catalysts such as diazabicyclooctane (DABCO) or 4-dimethylaminopyridine. Trimerization takes place without releasing volatile substances, thereby making it possible to obtain flawless casting compounds. Cyanate esters, as cured duromers, have high glass-transition temperatures, Tg, of up to 400° C., and a low dielectric constant. Cyanate ester monomers typically include two OCN groups, and therefore trimerization results in a three-dimensionally cross-linked duromer.

The cyanate esters that are used may be, in particular, the cyanates of a bisphenol. Examples of bisphenol-based cyanate esters are bisphenol A cyanate ester, hexafluoro bisphenol A cyanate ester, bisphenol E cyanate ester (4,4-ethylidene diphenyl cyanate ester), tetramethyl bisphenol F cyanate ester, bisphenol M cyanate ester, bisphenol C cyanate ester, and cyclopentadienyl bisphenol cyanate ester. Other suitable cyanate esters are, e.g., novolac cyanate ester and phenol novolac cyanate ester.

Any polyorganosiloxanes that form rubber-elastic polymers after cross-linking may be used for the polyorganosiloxanes that are used according to the present invention. The glass-transition temperature, Tg, is preferably in the range of −80 to −120° C.

Polyorganosiloxanes may be used that are derived from siloxane units having the general formula $$—(R_2SiO)— \tag{1}$$

in which the two monovalent groups R, which may be identical or different, are linear or branched alkyl groups having 1 to 18 C atoms, cycloaliphatic groups having 4 to 8 C atoms, linear or branched alkyl groups having 2 to 4 C atoms, phenyl- or alkylphenyl groups having 1 to 12 C atoms in the aliphatic group—it being possible to also substitute halogens or hydroxyl-, carboxyl-, carbonic acid anhydride, amino-, epoxy-, alkoxy- or alkenyloxy groups for the hydrocarbon groups—and polyether- or polyolefine groups and hydrogen, the groups being bonded together directly or via an oxygen or nitrogen atom with a silicon atom of the polysiloxane chain.

Examples of such groups R are methyl-, ethyl-, isopropyl-, isobutyl, dodecyl- and octadecyl groups, cyclopentyl-, cyclohexyl- and cyclooctyl groups, vinyl-, allyl-, isopropenyl and 3-butenyl groups, ethylphenyl-, dodecyl groups, and groups having hydrocarbon groups that are partially substituted, e.g., by halogens such as fluorine or chlorine, as is the case, e.g., with chloropropyl or the 1,1,1-trifluoropropyl group. At least a portion of the groups R may also consist of polymeric groups, in particular polyethers, such as polyethylene-, polypropylene-, polybutylene or polyhexamethylene glycol or polytetrahydrofuran and mixed polymers of these ethers, as well as polyolefins, e.g., polybutadiene, polyisoprene, polybutene, polyisobutene, or the like. Finally, a portion of the groups R may be hydrogen. It is also possible to use mixtures of the aforementioned polyorganosiloxanes.

Furthermore, it is possible, according to the present invention, to use polyorganosiloxanes in which various groups R are present in the polymer molecule. These various groups may be statistically distributed along the siloxane backbone. In a preferred embodiment, the polyorganosiloxane rubber, which is used according to the present invention, is a block copolymer, in which monovalent groups R' and R" are situated along the siloxane backbone in blocks that are derived from polymer units having the general formula $$—(R'_2SiO)_x—(R''_2SiO)_y— \tag{2}$$

in which the groups R' and R", which have the same meaning as R, differ from one another, while the groups R' and R" may be identical or different, and x and y are equal to 1, or are whole-number multiples thereof.

Due to their easy availability and good action, polyorganosiloxanes are preferred in which at least 50% of the groups R, R' and R" are methyl- and/or phenyl groups.

A modified reaction resin according to the present invention is characterized by high stability in storage. Surprisingly, the dispersion of finely distributed polyorganosiloxane particles in the cyanate ester remains stable even for longer storage periods. In this storable state, the polyorganosiloxane particles are preferably substantially already cross-linked to form a rubber-like polyorganosiloxane, while a cross-linking reaction of the cyanate esters has not taken place, or only in a small scope.

Preferably, the dispersed polyorganosiloxane particles may react with the cyanate ester via reactive groups located on their surface when the cyanate ester is brought to a reaction or curing.

A reaction resin according to the present invention preferably contains 40 to 98% by weight, and preferably 50 to 98% by weight of cyanate ester. Furthermore, a content of 2 to 60% by weight, and further preferably 2 to 50% by weight of polyorganosiloxane is preferred. Concentrations that are preferred for good fracture-mechanics properties while maintaining the highest possible module are 2 to 10% by weight, and further preferably 4 to 8% by weight.

The polyorganosiloxane is finely distributed in the reaction resin. Preferably, the dispersed particles have a mean diameter of 0.01 to 50 µm, further preferably 0.05 to 20 µm, and further preferably 0.1 to 5 µm.

The fine distribution of the liquid polyorganosiloxanes in the liquid reaction resins may be attained using all measures and auxiliary agents that are known for the manufacture of emulsions. They include, in particular, mechanical aggregates that unfold an adequately high shearing effect in the medium to be dispersed, such as stirrers, dissolvers, kneading devices, roller mills, high-pressure homogenizers, ultrasonic homogenizers, and the like. "Ultra-Turrax" dispersing devices are suitable for attaining a fine distribution. It is understood that the shear forces to be applied in order to attain a certain distribution are dependent on the viscosities of the polysiloxane and the reaction resin or the reaction resin mixture. At very high viscosities, in particular of the reaction resin, it is therefore necessary, under certain circumstances, to apply shear forces that are so high that appropriately strong dispersing machines must be used, or viscosities must be reduced by raising the temperature accordingly. However, the high temperatures that are used must not cause a noticeable cross-linking of the polyorganosiloxanes or the reaction resins during the dispersing phase. This may be checked in a manner known per se by making a suitable selection of the cross-linking systems.

While dispersing the polyorganosiloxanes, in order to attain the desired particle sizes and/or to stabilize the polyorganosiloxane dispersion that is attained, it may be necessary or desirable to use certain additives that have a dispersing effect. Dispersing agent additives are not needed in cases in which the siloxane component itself has adequate dispersing capability due to the suitable selection of a part of the groups R, R' or R" which advantageously have a chemical constitution that is highly compatible with the particular reaction resin. In all other cases, however, in which substituted polysiloxanes of this type are unavailable or are difficult to manufacture, it may be advantageous to use a separate dispersing agent. Compounds having an amphiphilic structure are preferably used as dispersing agents, in which case a portion of the groups of such amphiphilic molecules is selected such that it is compatible with the polyorganosiloxanes that are used, while another portion of the groups is selected such that it is compatible with the reaction resin or the reaction resin mixture.

The suitable dispersing agents therefore have an amphiphilic structure that is analogous to certain emulsifiers. Copolymers having a polyorganosiloxane portion and a carbon-organic part that is compatible with the reaction resin or the reaction resin mixture have been proven in particular and are therefore preferably used. The manufacture of copolymers of this type is basically known, and is described, e.g., in W. Noll, "Chemie und Technologie der Silikone", Weinheim 1968.

The dispersing agents that are suitable for use for the purpose according to the present invention are not critical in terms of their molecular weight, i.e., the molecular weight may vary within wide limits. Dispersing agents that have a mean molecular weight of 300 to 50,000 are preferably used. In any case, it is essential that the dispersing agent that is selected be situated at the phase interface between polyorganosiloxane and reaction resin under the conditions of the dispersing procedure.

The concentration of dispersing agent that is required is largely dependent on its activity, the chemical constitution of the polysiloxanes and reaction resins, and on the dispersing conditions. In practical application, good effects are attained using concentrations of 2-20% by weight, and preferably 5-15% by weight.

Polyether-polydimethyl siloxane copolymers are particularly preferred within the scope of the present invention. The polydimethylsiloxane portion of these copolymers is preferably approximately 25% by weight. Ethylene oxide and propylene oxide units may be preferably provided within the polyether portion; the preferred weight ratio of ethylene- and propylene oxide units in the polyether is approximately 40 to 60. A preferred molecular weight range is 10,000 to 15,000 g/mol, and further preferred, approximately 13,000 g/mol. The viscosity at 25° C. is preferably 2,000 to 4,000 mPas.

Surprisingly, it has been shown that copolymers of this type are capable of emulsifying polysiloxanes in cyanate esters, and emulsions or dispersions of this type are stable when stored for long periods of time.

The mean molecular weight of the liquid, non-cross-linked polyorganosiloxanes that may be used in the method according to the present invention may vary within wide limits, and generally lies in the range of 800 to 500,000. The lower limit is determined in that, as the molecular weight decreases, the cross-link density of the polyorganosiloxane rubber increases and its elasticity therefore decreases. However, this effect may be attenuated by adding bifunctional cross-linking agents in certain limits. The upper limit is defined by the viscosity of the polyorganosiloxanes, which increases as the molecular weight increases, and this hampers the desired fine distribution of the siloxanes in the liquid reaction resins. In a preferred embodiment of the method according to the present invention, the non-cross-linked polyorganosiloxane or polyorganosiloxane mixture that is used has a mean molecular weight in the range of 1,000 to 100,000, and particularly preferably of 1,200 to 30,000. It must be noted that polyorganosiloxanes, as is the case with most of the other polymers, do not have uniform molecular weights, but rather a more or less wide distribution of molecular weight.

The type of cross-linking via which liquid polyorganosiloxanes are converted to elastic silicone gum particles does not matter, provided it is ensured that the fine distribution of the polysiloxane particles is not substantially destroyed by the cross-linking reaction, and that no cross-linking reactions—or only insubstantial cross-linking reactions—take place in the reaction resin phase. Provided that these preconditions are met, any curing method that is typically used to cross-link polysiloxane elastomers may be used, in particular the known addition and condensation methods. Addition cross-linking polysiloxanes are preferred.

In order for addition cross-linking to be performed, a sufficient number of groups must be present in the polyorganosiloxane mixture, that include hydrogen that is bound directly to silicone, that is, SiH groups, and olefinically unsaturated groups that may be added to the SiH groups (the "hydrosilylation reaction"). In the simplest case, the cross-linkable polyorganosiloxane is a polydimethyl siloxane having vinyl terminal groups, to which 1 to 10% of a polymethyl hydrogen siloxane is added as the cross-linking agent. The addition cross-linking preferably takes place at room temperature, and possibly at high temperatures, e.g., between 60 and 140° C., in the presence of a noble metal catalyst. Compounds of elements from the platinum group of the periodic system are typically used for this purpose, e.g., platinum, palladium, or rhodium. A catalyst that is often used is, e.g., hexachloroplatinic acid, dissolved in suitable solvents, e.g., in glycol ether or isopropanol. Suitable catalysts are also the conversion products of noble metal chlorides with organic or silicone-organic compounds that contain vinyl groups, or the noble metals themselves in a fine distribution on suitable carriers such as activated carbon or aluminium oxide.

Condensation cross-linking siloxanes include easily cleaved groups that are bound directly to silicone, e.g., hydroxyl-, alkoxy-, acyloxy-, ketoximino-, amine-, aminoxy- or alkylamide groups or hydrogen. These cleavable groups may be located in the polyorganosiloxanes themselves, and/or in special silanes that are added as cross-linking agents. Condensation cross-linking polysiloxane elastomers that are frequently used are composed of polydimethyl siloxanes having hydroxyl terminal groups and tri- or tetraorgano oxysilanes that are added as cross-linking agents, such as methyltriacetoxysilane, tetraethoxysilane, methyltris (methylethylketoximino)silane or polymethylhydrogensiloxane. It is not absolutely necessary to use condensation catalysts, but it may be recommended if the duration of the cross-linking reaction should be shortened, or if the temperature required for the cross-linking should be lowered. Suitable catalyzers are primarily organic heavy metal salts, such as the known octoates, laurates, naphthenates or acetates, such as tin, zirconium, lead, and titanium.

These cross-linking methods that are known for the manufacture of siloxane elastomers may be expanded using cross-linking reactions that may induce the three-dimensional cross-linking of linear polyorganosiloxane molecules. The reactive groups that are required for cross-linking reactions of this type may be located directly on the polysiloxane backbone, as described above for the known cases of addition and condensation cross-linking, and they may be bonded to the organic groups R, R' or R" having the aforementioned formulas (1) and (2), and they may be identical to the above-described functional groups with which these groups may be substituted.

In terms of attaining the purpose according to the present invention, the type of cross-linking per se it not decisive, but rather any type of cross-linking is suitable in which substantially three-dimensionally cross-linked polyorganosiloxanes are formed, the cross-link density of which is low enough to provide the cross-linking product with elastomeric, not resin-type properties, but which is also sufficiently high for the cross-linking product to have a minimum measure of rubber-elastic properties.

The mean particle size of the polyorganosiloxane rubber particles and their size distribution influence the essential properties of the cured modified reaction resin, in particular its resistance to breakage and impact. In order to attain the success that is aimed for according to the present invention, it is therefore advantageous for the particle sizes to lie in the aforementioned preferred range, and a better effect is attained when, instead of a very narrow ("unimodal") distribution, a broad distribution of particle size, e.g., across the entire particularly preferred range of 0.1 to 5 µm, is present. The particle size distribution may be characterized, e.g., by a continual diameter distribution curve in the manner of a Gaussian distribution curve, or it may be composed of two or three size classes, each of which has a narrow size distribution ("bi- or trimodal").

The desired particle size distribution of the cross-linked polyorganosiloxane rubber particles located in the reaction resin matrix may be predetermined during the dispersing procedure when the non-cross-linked polyorganosiloxane droplets are formed via the selection of shearing forces, and possibly via the selection of the dispersing agent, and it may be controlled within wide limits. Care should be taken to ensure that the particle size distribution that is attained via dispersion remains substantially unchanged in the subsequent method steps, in particular during cross-linking of the polyorgano siloxanes and during curing of the reaction resins. However, it is also possible and does not affect the success aimed for according to the present invention, or does so only minimally, when a portion of the particles formed via dispersion coagulate or agglomerate in the subsequent method steps, i.e., they bond to form particles having a larger diameter. This normally results in particles having different size classes, which may result, e.g., in the aforementioned bi- or trimodal size distribution.

As mentioned above, in order to improve the resistance to breakage and impact of the cured modified reaction resins, it is advantageous for the finely distributed polysiloxane rubber particles to enter into a chemical reaction with the reaction resin. The binding is advantageously brought about via a chemical reaction between reactive groups located on the surface of the rubber particles and corresponding reactive groups that are present in the reaction resin, the reactive groups that are located on the surface of the polysiloxane particles being matched to the reactive groups of the particular cyanate ester.

For the polyorganosiloxane rubber particles to react chemically with the reaction resin, the reactive groups must be located on the surface of the polyorganosiloxane rubber particles. This may be realized, e.g., by the R, R' or R" groups contained in the polyorganosiloxane carrying corresponding reactive substituents, as explained above as an example. It is preferable for these substituents to not influence the cross-linking reaction of the polyorganosiloxanes in an undesired manner. A further possibility is the corresponding, at least partial substitution of the dispersing agent, which is optionally used in the dispersing procedure of the polyorganosiloxanes, with the desired or required reactive groups. This may be realized in a particularly easy manner using the method according to the present invention by ensuring that, when selecting a suitable amphiphilically constructed dispersing agent, its carbon-organic component includes suitable reactive groups. In a preferred embodiment of the method according to the present invention, a dispersing agent having a carbon-organic portion is therefore used that includes reactive groups that, as reaction mediators, may bring about chemical bonds between the polyorganosiloxe particles and the reaction resin or the reaction resin mixture.

A further possibility results form the use of additives that serve as reaction mediators. To ensure that the silicone rubber particles are chemically anchored to the resin matrix, a reaction mediator of this type must also include chemical groupings that bind it to the silicone rubber particles. Reaction mediators, of this type, between polyorganosiloxane rubber particles and reaction resin are preferably organoalkyloxy silanes and/or organo-silicone copolymers having reactive groups that are adapted to the polyorganosiloxanes and cyanate esters. Suitable organoalkyloxy silanes are, e.g., vinyl trimethoxy silane, glycidyloxypropyl trimethoxysilane, aminopiropyltriethoxysilane, methacryloyloxypropyltrimethoxysilane, and the like. Organo-silicone copolymers that are suitable for this purpose may basically have the same structure as the above-described dispersing agents. Examples of suitable organo-silicone copolymers are condensation products of low-molecular, silanol-terminated polydimethylsiloxanes with diglycidylethers, hydroxycarbonic acids and hydroxyl- and carbonic acid group-containing polyesters, aromatic polyhydroxy compounds, etc. Further possibilities result from the hydrosilylation of polymethylhydrogensiloxanes with compounds that, in addition to the desired reactive group, also include an olefinic double bond, such as allyl glycidyl ether, allyl alcohol, α-alkene alcohol started polyether, methacrylic acid allyl ester, 2-hydroxyethyl acrylate, malic acid anhydride, and the like. A person skilled in the art is familiar with the manufacture of these copolymers.

The reaction with which the polyorganosiloxane rubber particles should be chemically bound to the reaction resin matrix is advantageously carried out before or during the further processing of the modified reaction resin, the type and conditions of the execution being largely dependent on the type of reaction partners involved. In the simplest case, it is sufficient to raise the temperature accordingly in order to induce the desired reaction. Another possibility is to add a component that is capable of reacting with the reactive groups of polysiloxane particles, e.g., the above-mentioned reaction mediators, or these reaction-catalyzing component, to the reaction resin. The reaction component to be added; and the catalytically acting component may be identical to the corresponding components that induce the curing reaction of the reaction resin. In this case, the chemical binding reaction is preferably not carried out until the reaction resin should be cured after the shaping process, and optionally simultaneously with this curing.

A further subject of the present invention is a method for the manufacture of a modified reaction resin according to the present invention, which is characterized by the following steps:

a) mix the cyanate ester and the polysiloxane;
b) emulsify the polyslloxane in the cyanate ester; and
c) at least partially cross-link the finely distributed polyorqanosiloxane. The aspects of this method have already been addressed above, in conjunction with the discussion of the properties of the reaction resin.

According to this aspect of the method, the polyorganosiloxane may be dispersed in the cyanate ester or a portion of the cyanate ester, and a cross-linking agent for the polysiloxane may then be added. It is possible, for example, to disperse a "precatalyzed polysiloxane" (it already contains a platinum catalyst, for example) in a portion of the cyanate ester, and to then add a further portion of the cyanate ester before finally adding the cross-linking agent for the polysiloxane. Finally, the cross-linking of the dispersed polysiloxane particles into a polysiloxane rubber takes place.

The present invention is explained below with reference to examples.

The following starting materials were used:

Primaset LECy: (4,4'-ethylidene diphenyl dicyanate, Lonza Ltd.)

AROCY L 10: (4,4'-ethylidene diphenyl dicyanate, Huntsman Advanced Materials (Europe)

Emulsifier: Polyether-polymethylsiloxane copolymer polydimethylsiloxane portion 25% by weight, ratio EO/PO units 40/60, MW 13,000 g/mol, viscosity at 25° C. 3,000 mPas Silicone premixture: Premixture of 99.5% by weight, α,ω-divinylpolydimethylsiloxane and 0.5% by weight of a 1% solution of hexachloroplatinic acid in 2-propanol Cross-linking agent: α,ω-di(trimethylsilyl)polymethylhydrogensiloxane

EXAMPLE 1

Place 2500 g Primaset LECy and 660 g emulsifier in a 10 l laboratory dissolver, and mix for 5 min while stirring at 500/min in a vacuum.

Add 2600 g silicone premixture and disperse for 25 min (500/min in a vacuum). Next, add 2500 g Primaset LECy and disperse for another 15 min. Finally, add 66.7 g cross-linking agent and disperse for another 10 min.

A smooth, white to yellow dispersion was obtained.

The dispersion that was obtained was stored for 14 days at 20° C. in order to test its storability.

The following viscosities were measured (ball-plate viscosimeter, 25° C.)

Primaset LECy: 80 mPas

Modified reaction resin immediately after manufacture: 500 mPas

Viscosity of the reaction resin after 14 days/20° C.: 630 mPas.

The very low increase in viscosity after storage for 14 days proves that a modified reaction resin that is stable in storage was obtained.

EXAMPLE 2

Place 2500 g AROCY L 10 and 660 g emulsifier in a 10 l laboratory dissolver, and mix for 5 min while stirring at 500/min in a vacuum.

Add 2600 g silicone premixture and disperse for 25 min (500/min in a vacuum). Next, add 2500 g AROCY L 10 and disperse for another 15 min. Finally, add 66.7 g cross-linking agent and disperse for another 10 min.

A smooth, white to yellow dispersion was obtained.

The dispersion that was obtained was stored for 14 days at 20° C. in order to test its storability.

The following viscosities were measured (ball-plate viscosimeter, 25° C.)

AROCY L 10: 80 mPas

Modified reaction resin immediately after manufacture: 710 mPas

Viscosity of the reaction resin after 14 days/20° C.: 1,000 mPas

The very low increase in viscosity after storage for 14 days proves that a modified reaction resin that is stable in storage was obtained.

What is claimed is:

1. A modified reaction resin formed as an emulsion or dispersion with high storage stability, comprising:
 a) from 40-98% by weight of at least one cyanate ester with at least two cyanate groups that are cross-linkable with each other or that are polymerizable to form cyanate ester prepolymers that are cross-linkable with each other, without a release of volatile substances, wherein the modified reaction resin contains no other organic monomers or organic prepolymers except for said cyanate ester monomers or said cyanate ester prepolymers;
 b) from 2-60% by weight of at least one polyorganosiloxane that is a finely distributed particulate dispersed throughout the modified reaction resin;
 c) from 2-20% by weight of at least one dispersing agent for forming the storage stable emulsion or dispersion of the at least one polyorganosiloxane or a precatalyzed polyorganosiloxane in the modified reaction resin; and
 d) a cross-linker for said polyorganosiloxane, wherein said cross-linker comprises any of the group consisting of polyorganohydrogensiloxane, methyltriacetoxysilane, tetraethoxysilane and methyl-tris-(methylethylketoximino)-silane;
 wherein said at least one dispersing agent has an amphiphilic structure, in which a portion of the groups of such amphiphilic molecules is selected such that it is compatible with the polyorganosiloxane that is used, while another portion of the groups is selected such that it is compatible with the cyanate ester;

wherein said at least one dispersing agent is a copolymer of at least one polymethylsiloxane and at least one polyether, and said at least one polyether includes ethoxy units and/or propoxy units; and, wherein said copolymer of said at least one polymethylsiloxane and said at least one polyether comprises 25% by weight of a polydimethylsiloxane, wherein said ethoxy units and said propoxy units are present in a weight ratio of 40 to 60, and wherein said copolymer has a viscosity of 2,000 to 4,000 mPas at 25° C.

2. The modified reaction resin as recited in claim 1, wherein said at least one polyorganosiloxane is substantially cross-linked to form a rubber-like polyorganosiloxane, while a cross-linking reaction of said at least one cyanate ester has not taken place in the reaction resin, or only to a small degree.

3. The modified reaction resin as recited in claim 1, wherein the cyanate ester is selected from the group consisting of bisphenol- and novolac-based cyanate esters.

4. The modified reaction resin as recited in claim 1, wherein the finely distributed polyorganosiloxane consists of polyorganosiloxane particles that may react with the cyanate ester via reactive groups located on their surface.

5. The modified reaction resin as recited in claim 1, containing 50-98% by weight, of the cyanate ester.

6. The modified reaction resin as recited in claim 1, containing 2-50% by weight of the polyorganosiloxane.

7. The modified reaction resin as recited in claim 1, wherein the finely distributed polyorganosiloxane consists of polyorganosiloxane particles that have a mean diameter of 0.01-50 μm.

8. The modified reaction resin as recited in claim 1, wherein the polyorganosiloxanes are derived from siloxane units having the general formula

in which the two monovalent R groups, which may be identical or different, are linear or branched alkyl groups having 1 to 18 C atoms, cycloaliphatic groups having 4 to 8 C atoms, linear or branched alkyl groups having 2 to 4 C atoms, phenyl- or alkylphenyl groups having 1 to 12 C atoms in the aliphatic group—it being possible to also substitute halogens or hydroxyl-, carboxyl-, carbonic acid anhydride, amino-, epoxy-, alkoxy- or alkenyloxy groups for the hydrocarbon groups—and polyether- or polyolefine groups and hydrogen, the groups being bonded together directly or via an oxygen or nitrogen atom with a silicon atom of the polysiloxane chain.

9. The modified reaction resin as recited in claim 8, wherein the polyorganosiloxane is a block copolymer, in which monovalent groups R' and R" are situated along the siloxane backbone in blocks that are derived from polymer units having the general formula

in which the groups R' and R", which have the same meaning as R, differ from one another, while the groups R' and R" may be identical or different, and x and y are equal to 1, or are whole-number multiples thereof.

10. The modified reaction resin as recited in claim 8, wherein at least 50% of the groups R, R' and R" are methyl- and/or phenyl groups.

11. A method for manufacturing a modified reaction resin formed as an emulsion or dispersion with high storage stability, wherein said modified reaction resin comprises a) from 40-98% by weight of at least one cyanate ester with at least two cyanate groups that are cross-linkable with each other or that are polymerizable to form cyanate ester prepolymers that are cross-linkable with each other, without a release of volatile substances, wherein the modified reaction resin contains no other organic monomers or organic prepolymers except for said cyanate ester monomers or said cyanate ester prepolymers;

b) from 2-60% by weight of at least one polyorganosiloxane that is a finely distributed particulate dispersed throughout the modified reaction resin;

c) from 2-20% by weight of at least one dispersing agent for forming a storage stable emulsion or dispersion of the at least one polyorganosiloxane or the precatalyzed polyorganosiloxane in the modified reaction resin; and d) a cross-linker for said polyorganosiloxane, wherein said cross-linker comprises any of the group consisting of polyorganohydrogensiloxane, methyltriacetoxysilane, tetraethoxysilane and methyl-tris-(methylethylketoximino)-silane;

wherein said at least one dispersing agent has an amphiphilic structure, in which a portion of the groups of such amphiphilic molecules is selected such that it is compatible with the polyorganosiloxanes that are used, while another portion of the groups is selected such that it is compatible with the cyanate ester;

wherein said at least one dispersing agent is a copolymer of at least one polymethylsiloxane and at least one polyether, and said at least one polyether includes ethoxy units and/or propoxy units; and wherein said copolymer of said at least one polymethylsiloxane and said at least one polyether comprises 25% by weight of a polydimethylsiloxane, wherein said ethoxy units and said propoxy units are present in a weight ratio of 40 to 60, and wherein said copolymer has a viscosity of 2,000 to 4,000 mPas at 25° C.;

wherein said method comprises the steps of:

a) mixing the cyanate ester and polyorganosiloxane;

b) emulsifying the polyorganosiloxane in the cyanate ester with the at least one dispersing agent; and c) at least partially cross-linking the finely distributed polyorganosiloxane with said cross-linker.

12. The method as recited in claim 11, wherein the at least one dispersing agent is added in step a) and/or b).

13. The method as recited in claim 11, wherein said cross-linker for the polyorganosiloxane is added in step a) and/or in step b).

14. The method as recited in claim 13, wherein the polyorganosiloxane is emulsified in the cyanate ester, and then said cross-linker for the polyorganosiloxane is added.

15. A thermosetting plastic made from a modified reaction resin, as recited in claim 1.

16. The modified reaction resin as recited in claim 1, wherein the finely distributed polyorganosiloxane consists of polyorganosiloxane particles that have a mean diameter of 0.1-5 μm.

17. The modified reaction resin as recited in claim 1, containing 2-10% by weight of the polyorganosiloxane.

18. The modified reaction resin as recited in claim 1, wherein the cross-linker is a polymethylhydrogensiloxane.

19. The modified reaction resin as recited in claim 1, wherein the at least one cyanate ester is selected from the group consisting of bisphenol A cyanate ester, hexafluoro bisphenol A cyanate ester, bisphenol E cyanate ester, tetramethyl bisphenol F cyanate ester, bisphenol M cyanate ester, bisphenol C cyanate ester and cyclopentadienyl bisphenol cyanate ester.

* * * * *